US009299610B2

(12) United States Patent
Paleari et al.

(10) Patent No.: US 9,299,610 B2
(45) Date of Patent: Mar. 29, 2016

(54) METHOD FOR MANUFACTURING A TRANSISTOR WITH SELF-ALIGNED TERMINAL CONTACTS

(71) Applicant: STMicroelectronics S.r.l., Agrate Brianza (IT)

(72) Inventors: Andrea Paleari, Brugherio (IT); Giuseppe Croce, Missaglia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/714,738

(22) Filed: May 18, 2015

(65) Prior Publication Data

US 2015/0255341 A1    Sep. 10, 2015

Related U.S. Application Data

(62) Division of application No. 13/944,727, filed on Jul. 17, 2013, now abandoned.

(30) Foreign Application Priority Data

Jul. 17, 2012  (IT) .............................. MI2012A1244

(51) Int. Cl.
*H01L 21/768*    (2006.01)
*H01L 29/66*    (2006.01)
(Continued)

(52) U.S. Cl.
CPC ........ *H01L 21/76895* (2013.01); *H01L 21/743* (2013.01); *H01L 21/76897* (2013.01);
(Continued)

(58) Field of Classification Search
CPC ............ H01L 21/743; H01L 21/76897; H01L 29/1095; H01L 29/41758; H01L 29/41766; H01L 29/66477; H01L 29/66696; H01L 29/66704; H01L 29/66712; H01L 29/7802; H01L 29/7825; H01L 21/823418; H01L 29/0653; H01L 29/0657; H01L 29/41775; H01L 29/42368

USPC ......................................................... 438/301
See application file for complete search history.

(56) References Cited

U.S. PATENT DOCUMENTS 6,194,760 B1    2/2001  Lee
2004/0248330 A1    12/2004  Kitabatake et al.
(Continued)

FOREIGN PATENT DOCUMENTS

WO    WO-2011048800 A1    4/2011
WO    WO-2011161748 A1    12/2011

OTHER PUBLICATIONS

Italian Search Report for MI2012A001244 mailed Mar. 15, 2013 (2 pages).

(Continued)

*Primary Examiner* — Peter Bradford
(74) *Attorney, Agent, or Firm* — Gardere Wynne Sewell LLP

(57) ABSTRACT

A MOS transistor includes a semiconductor layer with a drain region and a body region. A first insulating layer is disposed over the semiconductor layer, a gate-precursor layer is disposed over the first insulating layer, a second insulating layer disposed over the first insulating layer and a third insulating layer disposed over the second insulating layer. A source opening extends through the third insulating layer, the second insulating layer, the gate-precursor layer, and the first insulating layer. An implant through the source opening forms a source-precursor region in the semiconductor layer. The source opening is then lined and an body contact opening is made through the liner, the source-precursor region and into the body region. An implant through the body contact opening forms the body contact region below the source-precursor. The body contact opening is then filled with a metal.

22 Claims, 5 Drawing Sheets

(51) Int. Cl.
*H01L 29/78* (2006.01)
*H01L 29/417* (2006.01)
*H01L 29/10* (2006.01)
*H01L 21/74* (2006.01)
*H01L 21/8234* (2006.01)
*H01L 29/06* (2006.01)
*H01L 29/423* (2006.01)

(52) U.S. Cl.
CPC ...... *H01L29/1095* (2013.01); *H01L 29/41758* (2013.01); *H01L 29/41766* (2013.01); *H01L 29/66477* (2013.01); *H01L 29/66696* (2013.01); *H01L 29/66704* (2013.01); *H01L 29/66712* (2013.01); *H01L 29/7802* (2013.01); *H01L 29/7825* (2013.01); *H01L 21/823418* (2013.01); *H01L 29/0653* (2013.01); *H01L 29/0657* (2013.01); *H01L 29/41775* (2013.01); *H01L 29/42368* (2013.01)

(56) References Cited

U.S. PATENT DOCUMENTS

| | | | |
|---|---|---|---|
| 2006/0255361 | A1 | 11/2006 | Oyabe et al. |
| 2007/0249124 | A1* | 10/2007 | Franco ................ H01L 29/0696 438/286 |
| 2009/0242976 | A1 | 10/2009 | Hino |
| 2011/0012267 | A1 | 1/2011 | Depetro et al. |
| 2011/0018068 | A1 | 1/2011 | Depetro et al. |
| 2011/0303979 | A1 | 12/2011 | Hirasozu et al. |
| 2012/0032273 | A1 | 2/2012 | Suzuki |
| 2012/0161201 | A1 | 6/2012 | Hsieh |
| 2012/0205670 | A1 | 8/2012 | Kudou et al. |
| 2013/0256698 | A1* | 10/2013 | Sdrulla ................ H01L 21/049 257/77 |

* cited by examiner

METHOD FOR MANUFACTURING A TRANSISTOR WITH SELF-ALIGNED TERMINAL CONTACTS

CROSS-REFERENCE TO RELATED APPLICATION

This application is a divisional from U.S. application for patent Ser. No. 13/944,727 filed Jul. 17, 2013, now abandoned, which claims priority from Italian Application for Patent No. MI2012A001244 filed Jul. 17, 2012, the disclosures of which are incorporated by reference.

TECHNICAL FIELD

This disclosure relates to generally relates to semiconductor devices. In more detail, an embodiment refers to field-effect transistors.

BACKGROUND

Recently, the growing trend of the integration-density increase of semiconductor devices has led to the size reduction of the elements used in integrated circuits (a process often called "scaling"), to allow the realization of complete integrated electronic systems. In particular, electronic systems including one or more circuits for management and distribution of electrical energy (often called "power circuits") next to the signal-processing circuits have had a great development, as in the case of the BCD (Bipolar CMOS DMOS) technology.

A basic integrated-circuit element is the transistor; in particular, in circuits with a high integration density, field-effect transistors are used, and in particular, transistors of the MOS type. Moreover, the integrated MOS transistors forming the integrated power circuit (as in motors-driving circuits and the like) in addition to being formed with small dimensions, are also able to withstand relatively high voltages (e.g., 10 Volts (V)-70V) and supply high currents (e.g., 1 Ampere (A)-10 A) to loads.

Unfortunately, the limitations in the realization of MOS transistors of small dimensions often arise from the limits of the technological processes used in the realization thereof. Indeed, the size reduction of the transistors (and more generally, of each electronic device) is hindered by constraints to which current integration techniques are subject to the voltages borne.

As described in U.S. Patent Application Publication Nos. 2011/0012267 and 2011/0018068, which are incorporated herein by reference, in the case of integrated MOS power transistors, it is known to form contact regions between regions and terminals of such an integrated power MOS on planes at different heights and close to each other in order to increase the compactness of the transistor.

However, a limit to the size reduction is imposed by the formation of an opening—called a source opening—for the definition of source regions and a body contact (for electrically coupling to a body region) of the MOS transistor by means of photolithography processes.

The optical lithography or photolithography, typically uses a projection of electromagnetic radiation through a mask for defining regions in semiconductor materials, conductive materials, or insulating materials to form one or more electronic devices (e.g., transistors) in a chip of semiconductor material.

In the MOS transistor, the source opening is formed on a plane at a different height (e.g., lower) relative to a plane (corresponding to the focal plane of the mask) on which are formed other portions of the transistor itself (such as drain contact regions and part of a gate electrode) and portions of low-voltage transistors for processing the digital signals generated on the same chip (in the case of BCD electronic systems).

Therefore, the source regions and the body contact (defined through a plurality of photolithographic masks) may be heavily affected by optical aberrations. In fact, the optical aberrations are accentuated in the case where the plane on which is defined a region is not located on the focal plane of the mask (i.e., are out of focus), as in the case just described. Consequently, the areas outside the focal plane of the mask may be defined in an imprecise manner (in particular the edges of the regions) inversely proportional to the size of such regions (due to the optical aberrations). In other words, there may be a reduced control over the size of the regions defined by the mask.

Generally, to compensate for optical distortion, one may increase the size of the photolithographic mask, or increase tolerances in the distances between regions to be defined. Unfortunately, this may have the effect of increasing the overall dimensions of the transistor (with respect to the case in which a surface of the chip is uniform), in other words, the reduction in the size of the transistor may be limited by the tolerances used to correct the optical deformations mentioned above.

SUMMARY

In general terms, an embodiment is based on the idea of defining compact source regions and the body contact through a self-alignment process.

In an embodiment, a method for integrating a MOS transistor on a chip of semiconductor material comprises: providing a chip structure that includes a layer of semiconductor material, in which are alternately formed drain regions with a first conductivity type and body regions with a second conductivity type, a first insulating layer disposed over the surface of the substrate, at least one gate-precursor region of conductive material disposed over the first insulating layer, a second insulating layer disposed over the first insulating layer and the gate-precursor region, and a third insulating layer disposed over the second insulating layer. The method further includes forming at least one source opening by removing overlapping portions, of the second insulating layer, the third insulating layer, the gate-precursor region and at least partially removing a corresponding portion of the first insulating layer.

In an embodiment, the method further includes forming at least one source-precursor region extending into the substrate from a surface portion below the at least one source opening, forming at least one fourth insulating layer on walls of the first insulating layer, the second insulating layer, the third insulating layer, and the gate-precursor region facing the source opening, prolonging the at least one source opening inside the substrate by removing a portion of the source-precursor region and exposing a further portion of the substrate, the step of extending the at least one source opening inside the substrate defining at least two source regions separated by the source opening, and forming at least one body contact region extending into the substrate from the further portion of the substrate exposed from the at least one source opening.

Another embodiment provides a corresponding integrated MOS transistor.

BRIEF DESCRIPTION OF THE DRAWINGS

One or more embodiments, as well as features and advantages thereof, will be better understood with reference to the following detailed description, given purely by way of a non-restrictive indication and without limitation, to be read in conjunction with the attached figures (wherein corresponding elements are denoted with equal or similar references and their explanation is not repeated for the sake of brevity). In this respect, it is expressly understood that the figures are not necessarily drawn to scale (with some details that may be exaggerated or simplified) and that, unless otherwise specified, they are simply intended to conceptually illustrate the structures and procedures described herein. In particular.

DETAILED DESCRIPTION

Figure 1:
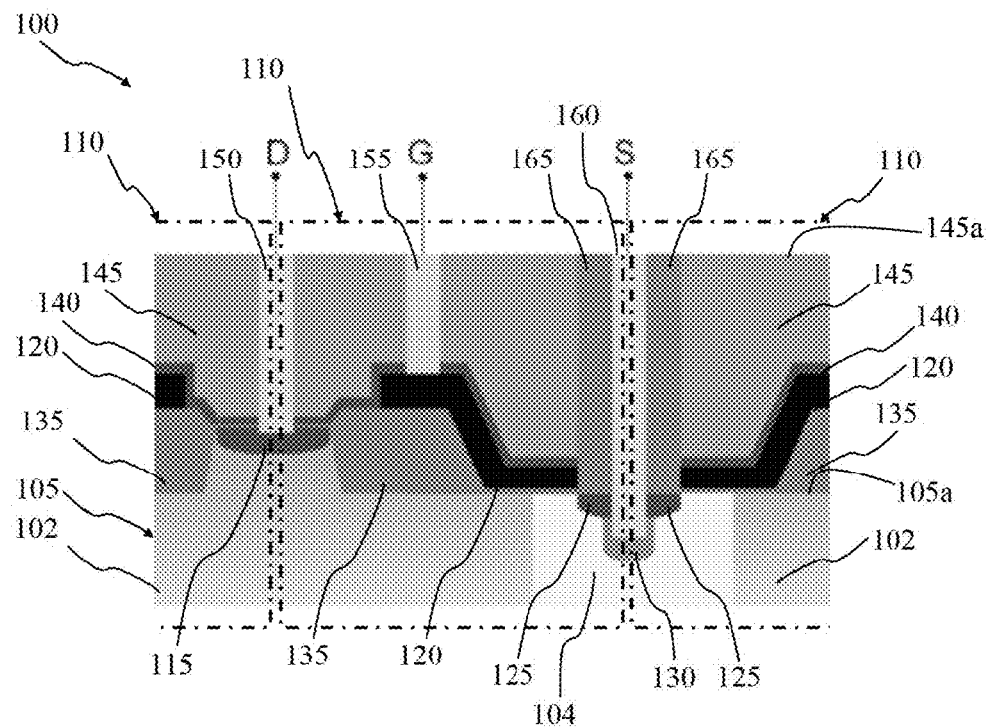
FIG. 1 is a schematic cross-sectional view of a portion of an MOS transistor, according to an embodiment.

With reference to the figures, FIG. 1 is a schematic cross-sectional view of a portion of transistor 100, according to an embodiment.

The transistor 100 is integrated in a chip which includes a layer indicated as a whole by reference number 105 of semiconductor material where alternate regions are made, each with a doping complementary to the doping of the adjacent regions. In the example considered, a drain region 102 of N-type (as in the case of Silicon doped with Phosphorus, Arsenic or Antimony) and a body region 104 of P-type (as in the case of Silicon doped with Boron) are formed. Moreover, the transistor 100 has a cellular structure, including a plurality of unit cells 110 (of which only one cell 110 and portions of a cell to the left and of a cell to the right are visible in the figures). The unit cells 110 are arranged in one or more sequences, each including at least one pair of cells 110, in which each cell 110 is formed in a mirrored way with respect to each adjacent cell 110 in the sequence.

The cellular structure allows obtaining a flow of electric current of high intensity without an excessive overheating of the transistor 100 during operation thereof—by intercoupling to one another corresponding terminals of each cell 110 (because the flow of electric current is divided between the cells 110 of the cell structure).

Each unit cell 110 forms a single transistor for example—of the MOS type—including a drain contact region 115 formed in an upper portion of the drain region 102. In particular, the drain contact region 115 is of the N-type as the drain region 102, but is characterized by a greater doping than the same (i.e., in the drain contact region 115 is present a greater number of charge carriers than in the surrounding drain region 102).

In addition, each unit cell 110 includes a gate region 120 of conductive material—for example, polycrystalline silicon or polysilicon, a source region 125 of the N-type and a body contact region 130 of the P-type. In particular, the source region 125 and the body contact region 130 are formed in an upper portion of the body region 104, with the body contact region 130 having a doping level greater than the doping level of the body region 104.

In addition, the body region 104 and the body contact region 130 are shared by a pair of cells 110 formed adjacent including a cell 110 in an odd position in the sequence and a subsequent cell 110 in an even position in the sequence or, vice-versa, from a pair of cells 110 adjacent-formed including a cell 110 in an even position in the sequence and a subsequent cell 110 in an odd position in the sequence (formed substantially symmetrical with respect to the body region 104 and the body contact region 130). Similarly, the drain region 102 and the drain contact region 115 are shared by an alternative pair of cells 110 adjacent-formed including a cell 110 in an even position in the sequence and a previous cell 110 in an odd position in the sequence or, vice-versa, from a pair of cells 110 adjacent-formed including a cell 110 in an odd position in the sequence and a previous cell 110 in an even position in the sequence (formed substantially symmetrical with respect to the drain region 102 and the drain contact region 130).

In detail, the drain contact region 115, is formed in the drain region 102, while the source regions 125 and the body contact 130 are formed in the body region 104, included in the layer 105 in correspondence of a surface 105 $a$ thereof (as will be described in greater detail in the following). It is noted that a first height y1 of the surface 105 $a$ where the drain contact region 115 is formed is higher than a second height y2 of the surface 105 $a$ where the source regions 125 and the body contact 130 are formed; this allows that, during the operation of the transistor 100, a channel region (in a portion of the body region 104 below the gate electrode) and a drain extension sufficiently long, at the same time containing a lateral extension x/of each cell 110 (as known).

On the surface 105 $a$ of the substrate 105 a first (field) insulating layer 135 (for example, Silicon Oxide) is disposed to substantially isolate the substrate 105 from the gate region 120. Indeed, above the insulating layer 135, substantially between the drain contact region 115 and the source regions 125 and the body contact 130 the gate region 120 is disposed.

In detail, the first insulating layer 135 has a profile of maximum thickness between the drain contact region 115 and a central portion of the gate region 120 that tapers until it reaches a minimum thickness in the proximity of the source region 125. The gate region 120 then follows the profile of the first insulating layer 135 but is formed with a substantially constant thickness. The profile and the thickness of the first insulating layer can be designed to optimize (during the operation of the transistor 100) a pattern of an electromagnetic field generated in the substrate below the gate region 120 by means of a biasing of the latter.

Over the first insulating layer 135 and the gate region 120, are arranged a second (internal) insulating layer 140 for example, silicon nitride and a third (surface) insulating layer 145 (for example, with a high degree of resistance to ion penetration)—for example, Silicon Oxide doped with Phosphorus to electrically and physically isolate the cell 105 from the upper layers such as, for example, metallization layers (not shown in the figures).

To realize the electrical contacts for biasing (during operation) the contact regions of drain 115, gate 120, source 125, and body 130 are provided corresponding drain 150, gate 155, source/body 160 contacts of conductor material (for example, tungsten) that pass through the insulating layers 135, 140 and 145 reaching such regions.

In an embodiment, the body contact region 130 is provided at a depth y3 from the surface 105 $a$ lower than the source region 125 which is formed substantially at the surface 105 $a$. In addition, the body contact region 130 (adapted to bias the body region 104 during operation of the transistor 100) is formed with a reduced body lateral extension x2 (e.g., lower than approximately 0.8 μm, for example, lower than approximately 0.6 μm, such as approximately 0.4 μm). In addition, the source/body contact 160 is surrounded by a vertical insulating layer 165 (for example, again in Silicon Oxide), which isolates the source/body contact 160 from the adjacent gate region 120. In this way, the source regions 125 and the body contact 130 are electrically intercoupled with each other (so as to operate at the same potential during operation of the transistor 100). In addition, the arrangement of the body contact region 130 adjacent to the source region 125, but formed at the depth y3 allows providing a source/body contact 160 with a reduced contact lateral extension x3 (e.g., equal to or lower than the body lateral extension x2). Indeed, the source regions 125 are contacted through the side portions of the source/body contact 160, while the body contact region 104 is coupled to an end portion thereof (and possibly also to the side portions thereof).

The body lateral extension x2 and the reduced contact lateral extension x3 of the body contact region 130 and of the source/body contact 160 also imply that the cells 110 of the sequence have a proportionally reduced lateral extension x1; therefore, the integrated transistor 100 will occupy a correspondingly reduced portion of the chip of semiconductor material. Therefore, a further portion of the chip of semiconductor material may be available for integrating additional electronic components, such as logic circuits and/or other power electronic components. In other words, the use of the transistor 100 according to an embodiment allows obtaining a denser integration of electronic devices on the same chip.

It should be noted that the transistor 100 just described is designed to operate at relatively high voltage intervals (e.g., at voltages range between approximately 5V and V, for example approximately between 8V and 70V, such as approximately between 10V and 50V) and suitable to be integrated onto a same chip in which are also integrated electronic devices (for example, additional transistors) designed to operate at lower voltage ranges (for example, at voltages approximately between 5V and 0V, for example approximately between 3V and 0V, such as approximately between 1V and 0V).

Considering now FIGS. 2A-2H, jointly, a process of forming a MOS transistor according to an embodiment is described, of which the figures show some steps.

Figure 2A:
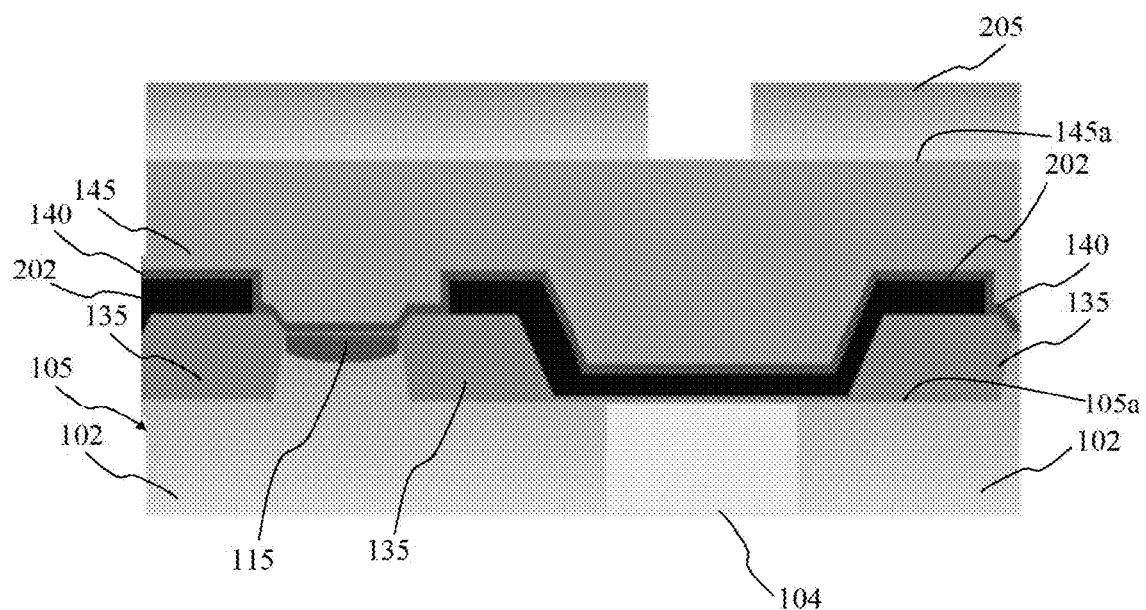
FIGS. 2A-2I show some phases of a formation process of a MOS transistor, such as the MOS transistor of FIG. 1, according to an embodiment.

With particular reference to FIG. 2A, the process is described starting from a structure including the substrate 105, the drain contact region 115, the first and the second and the third insulating layers 135, 140 and 145 (formed in a known manner and therefore not described in detail). In particular, the structure also includes a gate-precursor region 202, which is substantially equally shared between alternating pairs of adjacent cells 110.

In this phase, a source mask 205 is arranged onto the structure at a surface 145a of the insulating layer 145 (i.e. on the top of the structure). The source mask 205 may include a Bottom Anti-Reflective Coating or BARC (not shown in the figures) adapted to reduce optical distortion of a photolithographic process due to reflections at the surface 145a.

Figure 2B:
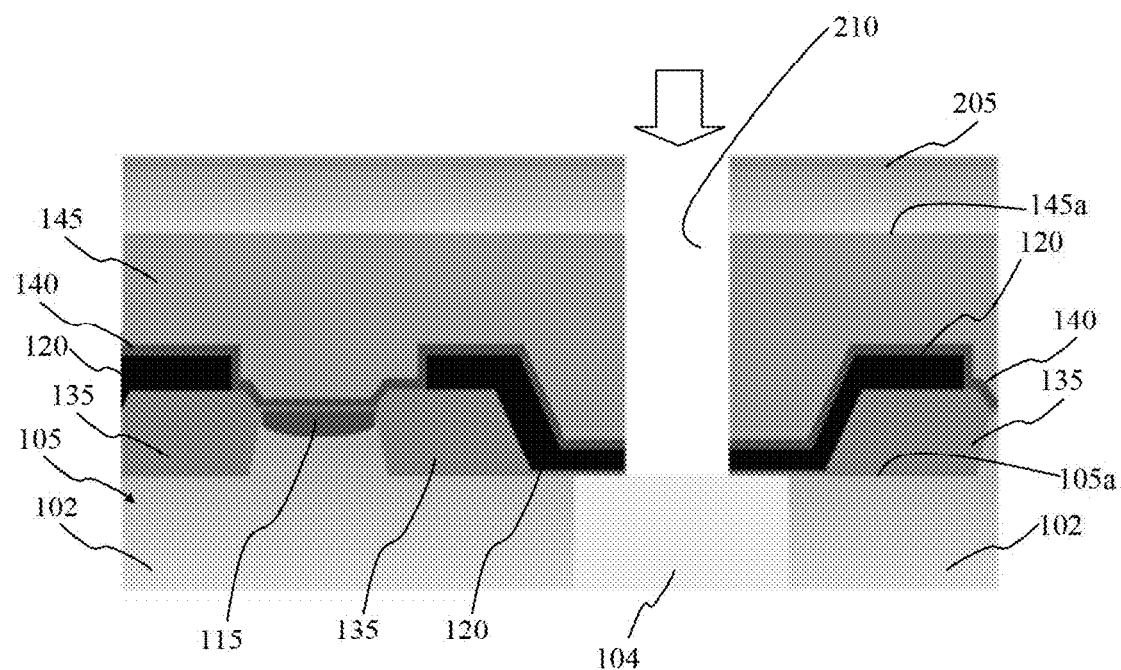

Turning now to FIG. 2B, the structure is subjected to a first anisotropic etching (conceptually indicated by an arrow in the figure, for example, a plasma etching as the RIE technique, Reactive Ion Etching) to form a source opening 210 having a lateral extension x3. In particular, the opening 210 is formed by removing a portion of the insulating layers 140 and 145, of the precursor region of gate 202 and at least partially a portion of the insulating layer 135 determined by the mask 205. In addition, the first anisotropic etching defines the two gate regions 120 of the pairs of adjacent cells 110.

Figure 2C:
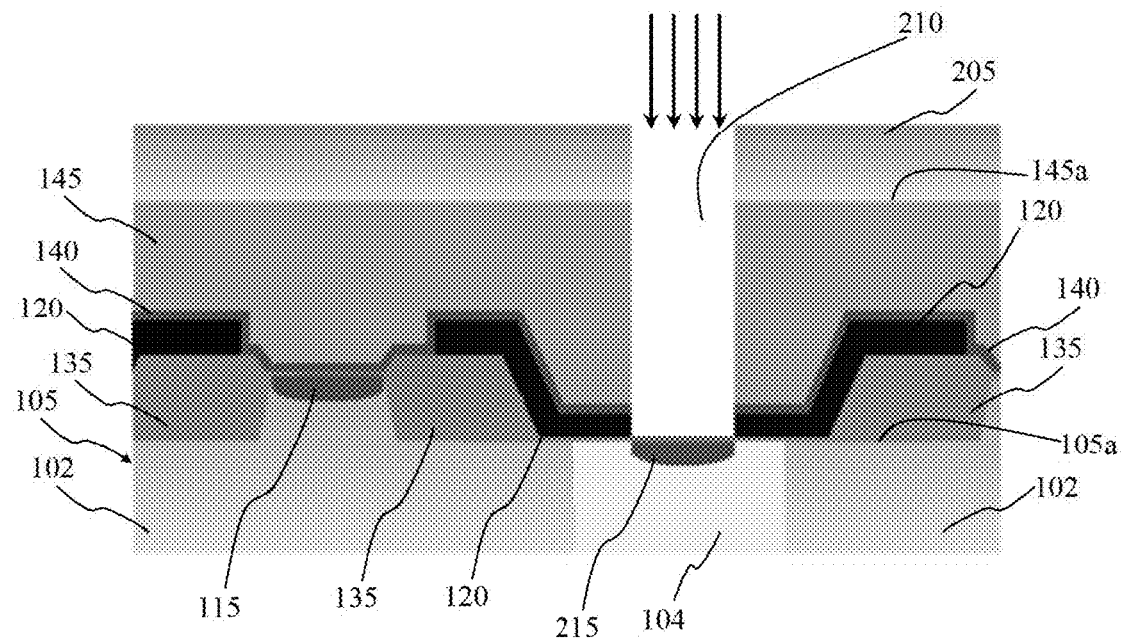

As shown in FIG. 2C, a source-precursor region 215 is formed in the substrate 105 from the surface 105a thereof. The source-precursor region 215 may be formed thanks to a phase of ion implantation (conceptually represented by a plurality of arrows). A partial removal of the insulating layer 135 reduces structural damages to the body region 104 due to the impact force of the ions during their implantation. Indeed, the insulating layer 135 reduces the impact force of the ions without reducing the efficacy of the ion-implantation phase, thus allowing forming a more robust and efficient transistor 100.

Figure 2D:
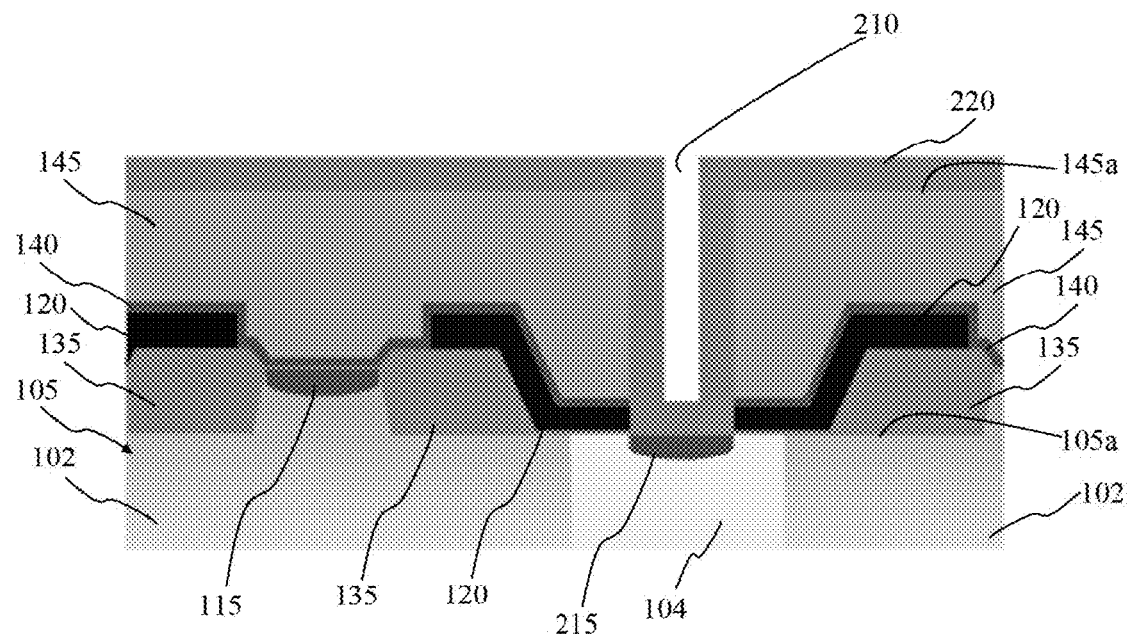

With reference to FIG. 2D, the source mask 205 is removed from the structure (exposing the surface 145 a of the insulating layer 145). Then, an insulating material 220 (e.g., Silicon Oxide) is deposited over the entire exposed surface and penetrates inside the source opening 210 (for example, by a conformal deposition in vapor phase). The deposition takes place on the walls of the insulating layers 135, 140, and 145 and the gate region 120, which delimit the source opening 210. In particular, with this deposition phase the gate region 120 is electrically isolated from the source opening 210. In addition, a lateral extension of the source opening 210 is reduced proportionally to the insulating material 220 deposited (for example, the lateral extension of the source opening 210 is reduced compared to the initial value to approximately 0.1 to 0.7, for example is reduced to approximately 0.2 to 0.5, and such as reduced to approximately 0.25 to 0.4, as a reduction of approximately 0.3 times compared to the initial value of the lateral extension). The insulating material 220 may be deposited through a vapor-phase deposition (thus, the deposition of the insulating material 220 may occur rapidly and economically).

Subsequently, an excess of insulating material 220 is removed from the surface 145a of the insulating layer 145; for example, by a step of chemical mechanical planarization or CMP (Chemical-Mechanical planarization) then defining the vertical insulating layer 165.

Figure 2E:
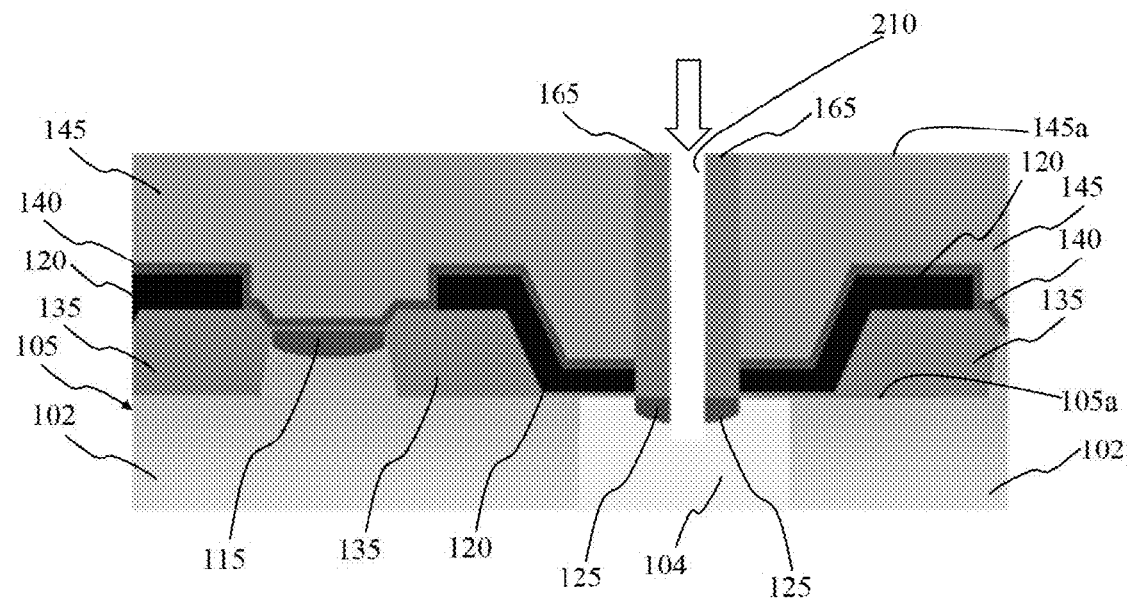

Turning now to FIG. 2E, the structure is subjected to a second anisotropic etching (conceptually shown in the figure by another arrow; for example, again a RIE technique) substantially orthogonal to the surface portion 105 a of substrate 105 exposed on the bottom of the source opening 210. In this way, the second anisotropic etching has the effect of extending the source opening 210 within the substrate 105 in the body region 104. In particular, the second anisotropic etching removes a (central) portion of the source-precursor region 215 (substantially shared by two adjacent cells 110). Therefore, at the same time two source regions 125 are defined belonging to two adjacent cells 110 (substantially symmetrical with respect to the source opening 210).

It is noted that the insulating layers 145 and 165 compensate for the absence of a mask at this phase; indeed, the second anisotropic etching has an effect only on the source-precursor region 215 and on the substrate region 105 on the bottom of the source opening 210. In contrast, the remaining structure is shielded by the insulating layers 145 and 165 and is not subjected to the second etching.

Figure 2F:
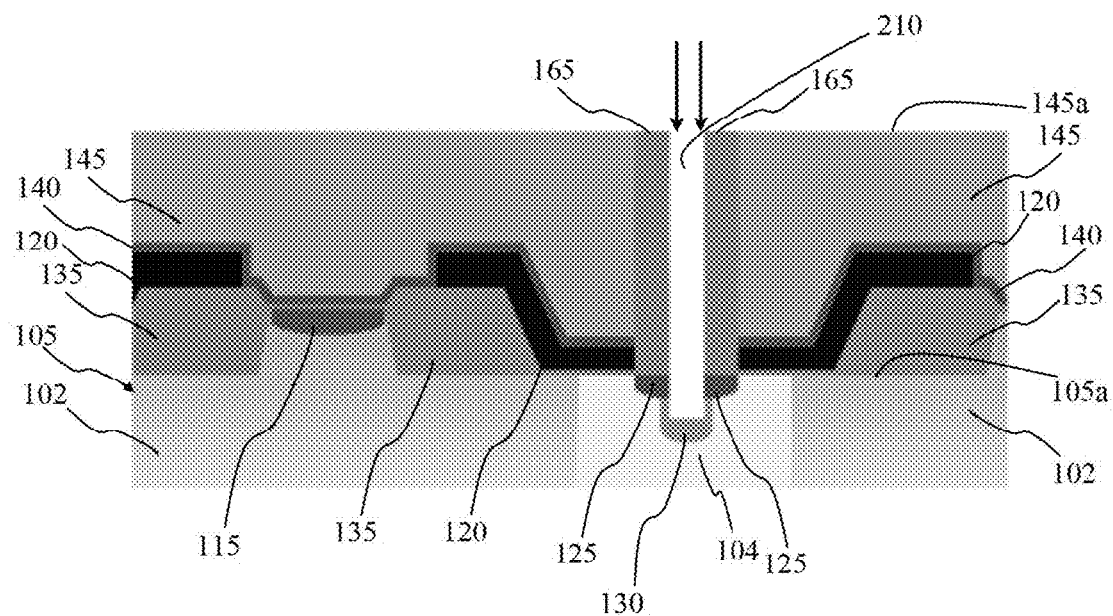

Considering now FIG. 2F, the body contact region 130 is formed in the substrate 105 from the portion thereof which delimits the source opening 210. The body contact region 130 may be formed thanks to an ion-implantation phase (represented conceptually by another plurality of arrows in the figure).

In particular, the implantation phase of the body contact region 130 is performed without the need for arranging a special mask on the structure. As in the previous phase, the insulating layers 145 and 165 compensate for the absence of the mask by shielding regions of the structure from the implantation of semiconductor material. In addition, a lateral extension of the insulating layer vertical 165 (defined by the thickness deposited in the previous deposition phase thereof) substantially determines the lateral extension x2 of the body contact region 130 (resulting in the reduction of the lateral extension of the source opening 210).

This implies that the implantation phase of the body contact region 130 in the portion of substrate 105 that delimits one end of the source opening 210 is not subject to optical distortion mentioned above; accordingly, it is not necessary to impose significant tolerances to distances between regions to be defined, and may be obtained by the body regions 130 with the body lateral extension x2 contained (e.g., equal to approximately 0.9 to 0.1, for example, approximately 0.5 times the body lateral extension x2 that would be obtained by using a mask). In addition, the ion-implantation phase, substantially, introduces few, if any, impurities (i.e., unwanted particles with an unsuitable atomic number, for example Boron atoms in an N region) and causes little or no weakness in the structure of active regions (for example, the drain 115, gate 120 and source 125 regions) of the structure.

Figure 2G:
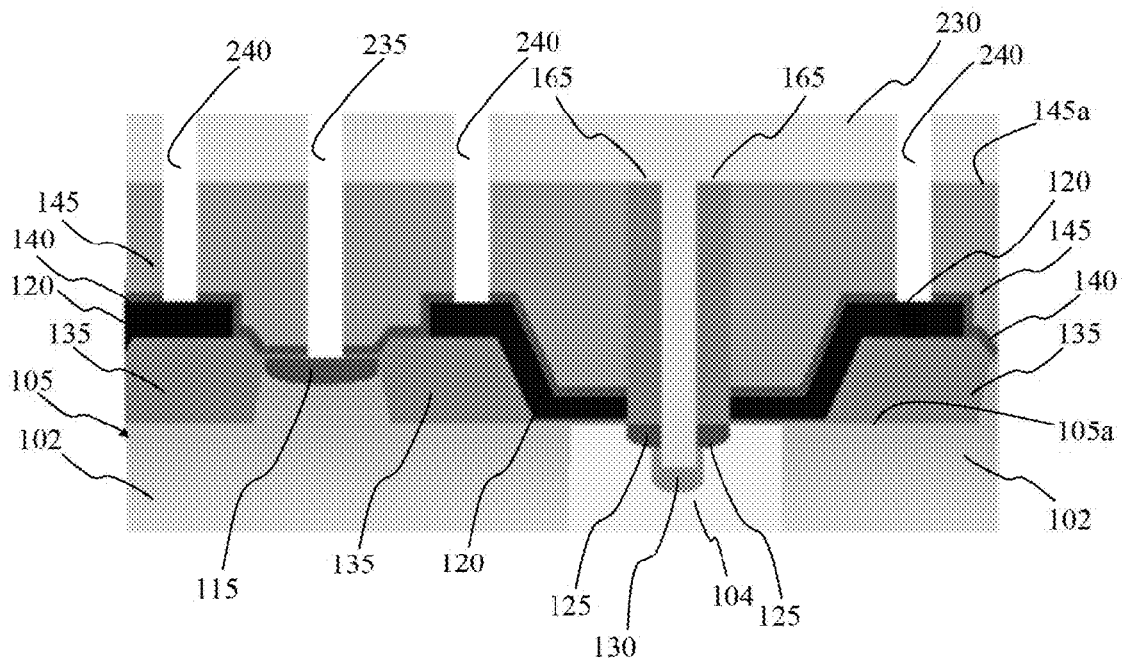

Turning now to FIG. 2G, on the structure is arranged a gate and drain contact mask 230 in correspondence of a surface 145a of the third insulating layer 145 (i.e. on the top of the structure). The gate and drain contact mask 230 allows defining corresponding gate 235 and drain 240 openings. Also in this case, the gate and drain contact mask 230 may including an anti-reflection sub-layer. Furthermore, this gate and drain contact mask 230 may coincide with a mask used to define contacts of other electronic devices present in the same chip (both suitable for high voltage levels and suitable for voltage levels reduced as the case of an integrated system in BCD technology). Subsequently, the structure is subjected to a third anisotropic etching that removes portions of the insulating layers 140 and 145 down to the point of exposing respective portions of the gate region 120 and of the drain region 115.

Figure 2H:
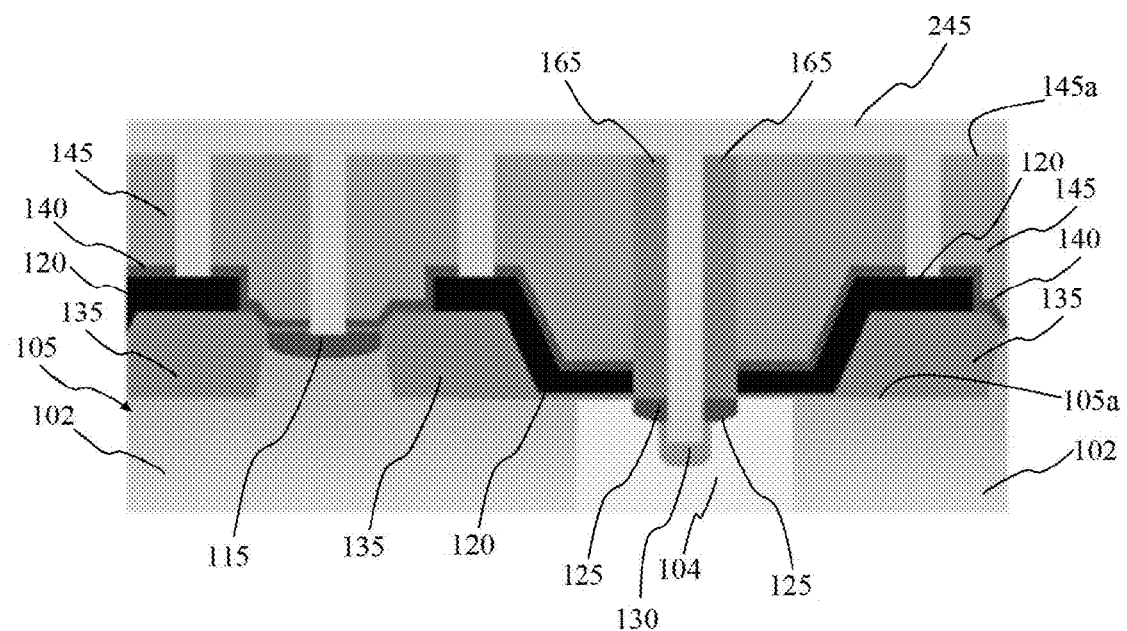

With reference to FIG. 2H, the gate and drain contact mask 230 is removed and there is a phase of deposition of conductive material 245 (typically including a combination of different materials; for example, Titanium, Titanium Nitride, and Tungsten) suitable for ensuring a good electrical contact with the exposed surfaces of the regions 115, 120, 125, and 130 (for example silicon or silicide of refractory materials) and suitable to ensure a good filling of the openings 210, 235, and 240. The total amount deposited is such as to completely fill the source opening 210, the gate opening 235 and the drain opening 240 (i.e., from the corresponding source regions 125 and the body 130, gate 120 and drain 115 contact up to the 145 a surface of the third insulating layer 145).

Figure 2I:
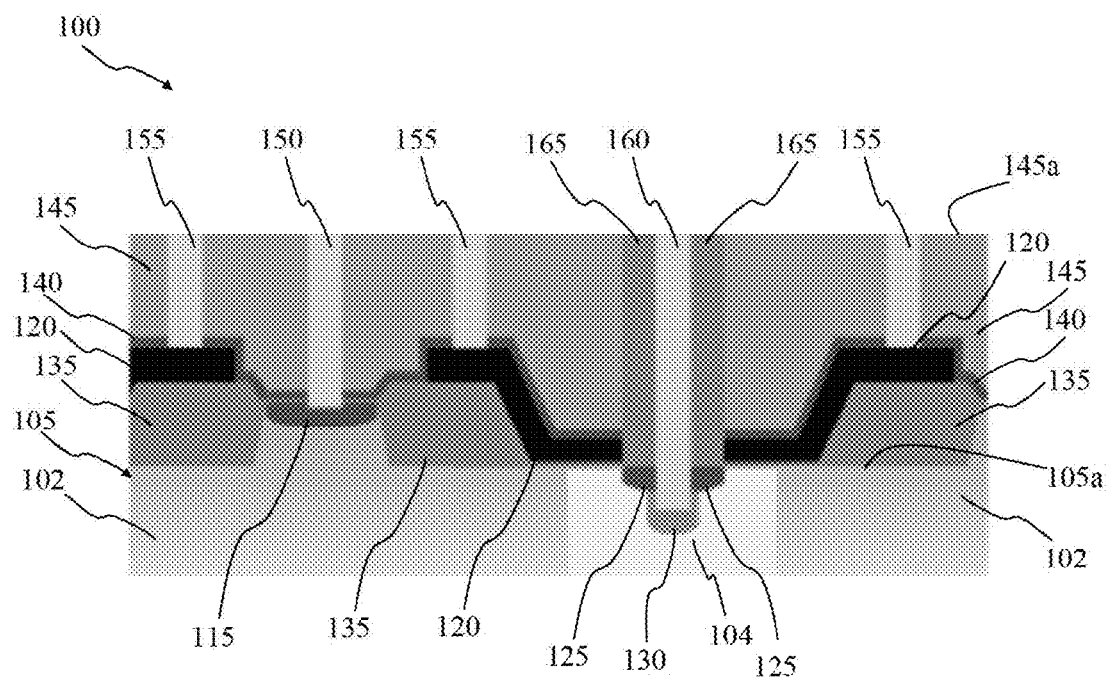

Turning now to FIG. 2I, the structure is subjected to a further phase of chemical-mechanical planarization in order to remove excess conductive material 245 and even out the surface 145a of the insulating layer 145 followed by a heat treatment to ensure good contact between the source region and the body contact. Consequently, the source/body contact 160, the gate contact 155, and the drain contact 150 are completely defined.

At the end of this phase, the above-described transistor 100 is formed. The source/body contact 160, the gate contact 155, and the drain contact 150 are exposed on the surface 145a of the insulating layer 145 in such a way as to allow forming an electrical coupling of the corresponding source 125 and body 104 regions (through the body contact region 130), the gate 125 and the drain 102 (through the drain contact region 115) with the upper layers (for example, by metallization layers, not shown in the figures) or other electronic components integrated in the chip of semiconductor material.

It is noted that the process described above may require only one additional photolithographic mask with respect to a traditional process to define the source opening 210; therefore, the transistor 100 is subject to inaccuracies due to optical aberrations to a lesser extent compared to transistors made using traditional techniques.

The steps described above may be executed in parallel, i.e., at the same time, on more unit cells 110 included in the transistor 100. In addition, the steps described above may be performed in parallel on multiple cells 110 belonging to more transistors 100. In general, alternative embodiments may be implemented using one or more equivalent methods (using similar steps with the same functions of several steps or portions thereof, by removing some non-essential steps, or by adding additional optional steps); also the steps may be performed in different order, in parallel or overlapping (at least in part). Furthermore, the source region 125 of a unit cell 110 may be a single region having an opening through which the source/body contact 160 extends, instead of the source/body contact dividing the source region into two separate regions 125. For example, referring to FIG. 1, the visible source-region portions 125 may form a single source region 125 by joining together in a plane other than the plane of FIG. 1.

Finally, it is noted that although in the description reference has been made only to an N-type transistor, it is possible to provide an embodiment including a complementary transistor of the P-type (i.e., with P-type drain regions and drain contact and source and body regions and the body contact of the N-type).

An integrated circuit including the transistor 100 may be coupled to at least one other integrated circuit to form a system. For example, at least one of these integrated circuits may be a computing circuit such as a microprocessor or microcontroller, and these integrated circuits may be disposed on the same, or on different, integrated-circuit dies. And examples of such a system include a smart phone, a camera, and a computing device such as a desktop, laptop, pad, or handheld computing device.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. A method for integrating a MOS transistor in a chip of semiconductor material, the method comprising:
   forming a drain region with a first conductivity type and a body region with a second conductivity type in a substrate layer of semiconductor material,
   depositing a first insulating layer disposed over a surface of the substrate layer,
   forming a gate-precursor region of conductive material over the first insulating layer,
   depositing a second insulating layer over the first insulating layer and the gate-precursor region,
   depositing a third insulating layer over the second insulating layer,
   forming at least one source opening over the body region by removing overlapping portions of the third insulating layer, the second insulating layer and the gate-precursor region and at least partially removing a corresponding portion of the first insulating layer,
   forming at least one source-precursor region extending into the substrate from a surface portion below the at least one source opening,
   forming a fourth insulating layer lining walls of the source opening, extending the at least one source opening into the substrate layer by removing a portion of the source-precursor region and exposing a further portion of the substrate layer so as to define at least two source regions separated by the extended source opening, and forming at least one body contact region extending into the substrate layer from the further portion of the substrate exposed from the extended source opening.

2. The method for integrating a MOS transistor according to claim 1, wherein the step of forming the at least one source opening comprises defining at least two gate regions separated by the at least one source opening.

3. The method for integrating a MOS transistor according to claim 1, wherein the step of forming the at least one source opening comprises forming the at least one source opening by means of anisotropic etching.

4. The method for integrating a MOS transistor according to claim 3, wherein the step of extending the at least one source opening comprises prolonging the at least one source opening through a further anisotropic etching orthogonal to the surface of the substrate layer.

5. The method for integrating a MOS transistor according to claim 1, wherein the step of forming the at least one source-precursor region further comprises forming the at least one source-precursor region by means of ion implantation.

6. The method for integrating a MOS transistor according to claim 5, wherein the step of forming at least one body contact region comprises forming the at least one body contact region by means of a further ion implantation.

7. The method for integrating a MOS transistor according to claim 1, wherein the step of forming the at least one fourth insulating layer comprises:

deposition of an insulating material by means of a vapor-phase, and removing an excess of the insulating material through an operation of chemical-mechanical planarization.

8. The method for integrating a MOS transistor according to claim 1, further comprising the steps of:

depositing a conductive material in the at least one source opening to form a source-body contact, and removing an excess of the conductive material through an operation of chemical-mechanical planarization.

9. The method for integrating a MOS transistor according to claim 1, further comprising providing a chip plate between the second insulating layer and the third insulating layer of a material resistant to ion implantation.

10. A method, comprising:

forming an insulating region above a body region within a semiconductor substrate layer, forming a source opening extending at least partially through to the insulating region toward an upper surface of the semiconductor substrate layer at the body region;

implanting ions through the source opening into the body region to form a source region;

lining the source opening with insulating liner;

forming a body contact opening extending through a bottom of the insulating liner, any remaining portion of the insulating region and through the source region and into the body region underneath the source region;

implanting ions through the body contact opening into the body region to form a body contact region below the source region; and filling the body contact opening with a metal material that is in contact with the source region and the body contact region.

11. The method of claim 10, wherein forming the insulating region comprises:

depositing a first insulating layer, forming a gate-precursor region of conductive material over the first insulating layer, depositing a second insulating layer over the first insulating layer and the gate-precursor region, and depositing a third insulating layer over the second insulating layer.

12. The method of claim 11, wherein forming the source opening comprises:

removing overlapping portions of the third insulating layer, the second insulating layer, the gate-precursor region and at least part of a corresponding portion of the first insulating layer.

13. The method of claim 12, wherein removing defines two gate regions from the gate-precursor region that are separated by the source opening.

14. The method of claim 11, further comprising providing a chip plate between the second insulating layer and the third insulating layer, said chip plate comprised of a material resistant to ion implantation.

15. The method of claim 10, wherein forming the body contact opening extending through the source region removes a portion of the source region and to expose a portion of the body region and define two source sub-regions separated by the body contact opening.

16. The method of claim 10, wherein forming the source opening comprises performing an anisotropic etch.

17. The method of claim 10, wherein forming the body contact opening comprises performing an anisotropic etch.

18. A method, comprising:

forming a first opening in an insulating region above a body region of a semiconductor substrate;

forming a source region in the body region through the first opening;

forming a second opening in the body region adjacent to the source region through the first opening;

forming a body-contact region in the body region through the second opening; and forming a source-body contact in the second opening.

19. The method of claim 18, further comprising forming the first opening in a gate layer that is disposed above the body region.

20. The method of claim 18, wherein forming the second opening includes forming the second opening through the source region.

21. The method of claim 18, wherein forming the second opening includes dividing the source region into first and second source sub-regions with the second opening.

22. The method of claim 18, wherein forming the second opening includes:

forming a layer over a side and a bottom of the first opening to form an intermediate opening; and forming the second opening by removing through the intermediate opening a portion of the layer disposed over the bottom of the first opening.

* * * * *